United States Patent
Seto

(10) Patent No.: US 10,658,305 B2
(45) Date of Patent: May 19, 2020

(54) SEMICONDUCTOR DEVICE

(71) Applicant: TOSHIBA MEMORY CORPORATION, Minato-ku (JP)

(72) Inventor: Motoshi Seto, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/292,477

(22) Filed: Mar. 5, 2019

(65) Prior Publication Data

US 2020/0075505 A1 Mar. 5, 2020

(30) Foreign Application Priority Data

Sep. 4, 2018 (JP) ................ 2018-165194

(51) Int. Cl.

| | |
|---|---|
| *H01L 23/34* | (2006.01) |
| *H01L 23/48* | (2006.01) |
| *H01L 21/00* | (2006.01) |
| *H05K 7/00* | (2006.01) |
| *H01L 23/556* | (2006.01) |
| *H05K 9/00* | (2006.01) |
| *H01L 25/065* | (2006.01) |

(52) U.S. Cl.
CPC ........ *H01L 23/556* (2013.01); *H01L 25/0657* (2013.01); *H05K 9/0073* (2013.01); *H01L 23/481* (2013.01)

(58) Field of Classification Search
CPC . H01L 23/556; H01L 25/0567; H01L 23/481; H05K 9/0073
See application file for complete search history.

(56) References Cited

U.S. PATENT DOCUMENTS

| | | | |
|---|---|---|---|
| 5,264,726 A | 11/1993 | Yamaguchi et al. | |
| 8,326,626 B1 * | 12/2012 | Pettay | ...... G10L 15/26 704/246 |
| 8,710,676 B2 * | 4/2014 | Chou | ......... H01L 23/3675 257/621 |
| 2013/0114323 A1 | 5/2013 | Shindo et al. | |
| 2013/0143366 A1 | 6/2013 | Tam et al. | |
| 2014/0183730 A1 * | 7/2014 | Hisano | ........ H01L 23/3128 257/737 |
| 2018/0096735 A1 * | 4/2018 | Pappu | ............ G11C 29/14 |
| 2019/0287922 A1 * | 9/2019 | Takemoto | ....... H01L 24/11 |

FOREIGN PATENT DOCUMENTS

| | | |
|---|---|---|
| JP | 2013-55082 | 3/2013 |
| TW | 200844202 A | 11/2008 |
| TW | 201803063 A | 1/2018 |

* cited by examiner

*Primary Examiner* — Alonzo Chambliss
(74) *Attorney, Agent, or Firm* — Oblon, McClelland, Maier & Neustadt, L.L.P.

(57) ABSTRACT

A semiconductor device according to an embodiment includes a substrate, an α-ray shielding layer, a first semiconductor chip, and a second semiconductor chip. The α-ray shielding layer is provided on the substrate. The first semiconductor chip is provided on the α-ray shielding layer. The second semiconductor chip is provided on the first semiconductor chip, whose operation is controlled by the first semiconductor chip.

9 Claims, 2 Drawing Sheets

SEMICONDUCTOR DEVICE

CROSS-REFERENCE TO RELATED APPLICATIONS

This application is based upon and claims the benefit of priority from Japanese Patent Application No. 2018-165194, filed on Sep. 4, 2018; the entire contents of which are incorporated herein by reference.

FIELD

The embodiments of the present invention relate to a semiconductor device.

BACKGROUND

There is a known configuration of a semiconductor device, in which a controller chip is placed on a package substrate and a semiconductor memory chip is stacked on this controller chip, for example.

In some cases, the package substrate described above slightly contains a member that radiates an α-ray that is one of radioactive rays. In these cases, the α-ray radiated from the package substrate can cause malfunctions of the controller chip.

DETAILED DESCRIPTION

Embodiments will now be explained with reference to the accompanying drawings. The present invention is not limited to the embodiments.

A semiconductor device according to an embodiment includes a substrate, an α-ray shielding layer, a first semiconductor chip, and a second semiconductor chip. The α-ray shielding layer is provided on the substrate. The first semiconductor chip is provided on the α-ray shielding layer. The second semiconductor chip is provided on the first semiconductor chip, whose operation is controlled by the first semiconductor chip.

First Embodiment

Figure 1:
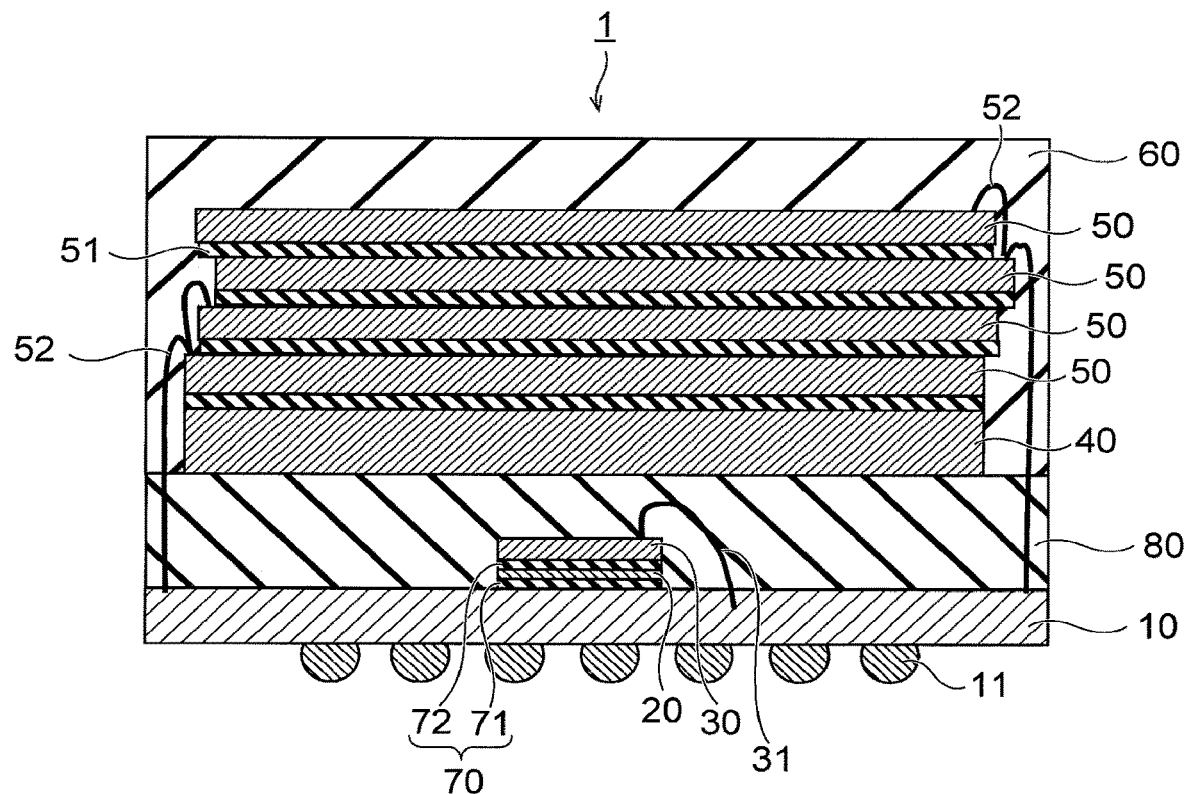
FIG. 1 is a cross-sectional view illustrating a configuration of a semiconductor device according to a first embodiment.

FIG. 1 is a cross-sectional view illustrating a configuration of a semiconductor device according to a first embodiment. A semiconductor device 1 illustrated in FIG. 1 includes a package substrate 10, an α-ray shielding layer 20, a first semiconductor chip 30, a dummy chip 40, a second semiconductor chip 50, and a mold resin 60.

The package substrate 10 is a glass substrate containing quartz or glass cloth, for example. A connection terminal 11 is provided on the back surface of the package substrate 10. A wiring layer (not illustrated) to be electrically connected to the connection terminal 11 is also provided in the package substrate 10.

The α-ray shielding layer 20 is provided on the package substrate 10. The α-ray shielding layer 20 is formed of a material that does not allow an α-ray to pass therethrough, for example, tungsten (W) or barium sulfate ($BaSO_4$).

In the present embodiment, the α-ray shielding layer 20 is provided in an adhesive 70. The adhesive 70 includes a first adhesive layer 71 and a second adhesive layer 72. The first adhesive layer 71 makes the α-ray shielding layer 20 adhere to the package substrate 10. The second adhesive layer 72 makes the first semiconductor chip 30 adhere to the α-ray shielding layer 20. The first adhesive layer 71 and the second adhesive layer 72 are formed by using a DAF (Die Attach Film), for example. Although the α-ray shielding layer 20 is formed between the first adhesive layer 71 and the second adhesive layer 72 in the present embodiment, a material that shields an α-ray may be added to the adhesive 70.

The first semiconductor chip 30 is a controller chip that controls an operation of the second semiconductor chip 50. This controller chip includes various elements and circuits. For example, an SRAM (Static Random Access Memory) and a driving circuit for this SRAM are provided in the second semiconductor chip 50. The first semiconductor chip 30 is electrically connected to a wiring layer (not illustrated) of the package substrate 10 by a bonding wire 31.

In the present embodiment, the first semiconductor chip 30 and the bonding wire 31 are covered with an adhesive 80. The dummy chip 40 and a plurality of second semiconductor chips 50 are stacked on the adhesive 80. That is, the adhesive 80 functions as a portion of an FOD (Film On Die) structure in which semiconductor chips are stacked on an adhesive.

The dummy chip 40 is provided on the adhesive 80. The dummy chip 40 functions as a base that stably supports the second semiconductor chips 50 on the adhesive 80. Therefore, the thickness of the dummy chip 40 is thicker than the thickness of the second semiconductor chip 50.

The second semiconductor chips 50 are stacked on the dummy chip 40. Adjacent ones of the second semiconductor chips 50 are made to adhere to each other with an adhesive layer 51 therebetween. Also, the lowermost second semiconductor chip 50 is made to adhere to the dummy chip 40 with the adhesive layer 51. The adhesive layer 51 is formed of a DAF, for example. Although four second semiconductor chips 50 are stacked in FIG. 1, the stacked number of the second semiconductor chips 50 is not specifically limited.

In the present embodiment, each second semiconductor chip 50 is a semiconductor memory chip that is a NAND flash memory. Each second semiconductor chip 50 is electrically connected to a wiring layer (not illustrated) of the package substrate 10 by a bonding wire 52.

A control signal output from the first semiconductor chip 30 passes through the bonding wire 31, the wiring layer of the package substrate 10, and the bonding wire 52, and is input to each second semiconductor chip 50. Operations such as a write operation and a read operation of each second semiconductor chip 50 are controlled on the basis of the input control signal.

The mold resin 60 covers the dummy chip 40 and the second semiconductor chips 50 entirely. Therefore, the dummy chip 40 and the second semiconductor chips 50 are sealed with the mold resin 60.

If a material radiating an α-ray (for example, uranium) is mined together with a material for the package substrate 10 in the semiconductor device 1 having the above configuration, the package substrate 10 inevitably contains the α-ray radiating member. Therefore, an α-ray can be radiated from the package substrate 10 toward the first semiconductor chip 30. In this case, malfunctions of the first semiconductor chip 30 can occur because of the influence of the α-ray.

However, in the semiconductor device 1 according to the present embodiment described above, the α-ray shielding layer 20 is formed between the package substrate 10 and the first semiconductor chip 30. Therefore, an α-ray radiated from the package substrate 10 does not pass through the α-ray shielding layer 20 and therefore does not reach the first semiconductor chip 30. Accordingly, it is possible to avoid malfunctions of the first semiconductor chip 30 caused by this α-ray.

Second Embodiment

Figure 2:
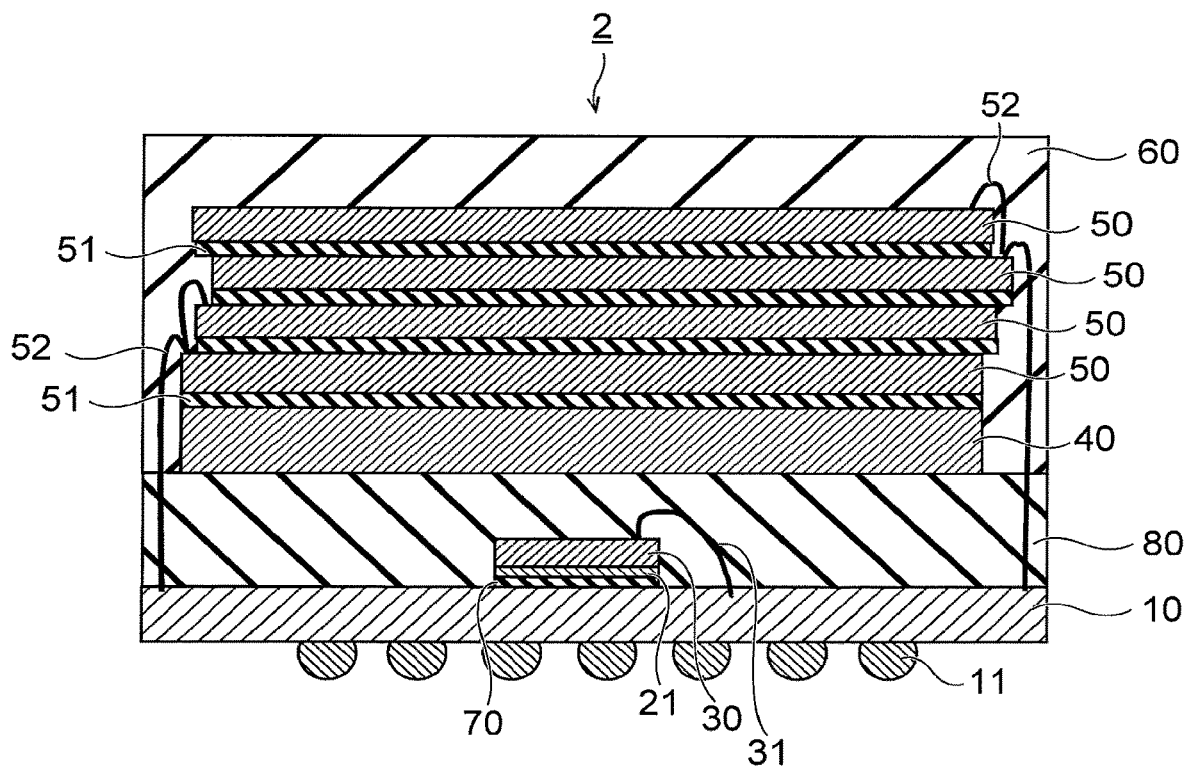
FIG. 2 is a cross-sectional view illustrating a configuration of a semiconductor device according to a second embodiment.

FIG. 2 is a cross-sectional view illustrating a configuration of a semiconductor device according to a second embodiment. Constituent elements identical to those of the semiconductor device 1 according to the first embodiment described above are denoted by like reference characters and detailed descriptions thereof will be omitted.

In a semiconductor device 2 according to the present embodiment, an α-ray shielding layer 21 is formed on the entire back surface (a surface opposed to the package substrate 10) of the first semiconductor chip 30. The α-ray shielding layer 21 is a metal layer containing tungsten. This metal layer can be formed by sputtering tungsten on the back surface of the first semiconductor chip 30. The first semiconductor chip 30 with the α-ray shielding layer 21 formed thereon is made to adhere to the package substrate 10 with the adhesive 70.

Also in the present embodiment described above, an α-ray radiated from the package substrate 10 does not pass through the α-ray shielding layer 21 and therefore does not reach the first semiconductor chip 30, as in the first embodiment. Accordingly, it is possible to avoid malfunctions of the first semiconductor chip 30 caused by this α-ray.

A material for the α-ray shielding layer 21 is not limited to tungsten, and is not specifically limited as long as it can shield an α-ray. Also, a method of manufacturing the α-ray shielding layer 21 is not limited to sputtering, but may be another deposition method. Further, the semiconductor device 2 according to the present embodiment may include not only the α-ray shielding layer 21 but also the α-ray shielding layer 20 described in the first embodiment. In this case, it is possible to further enhance an effect of shielding an α-ray.

(Modification)

Figure 3:
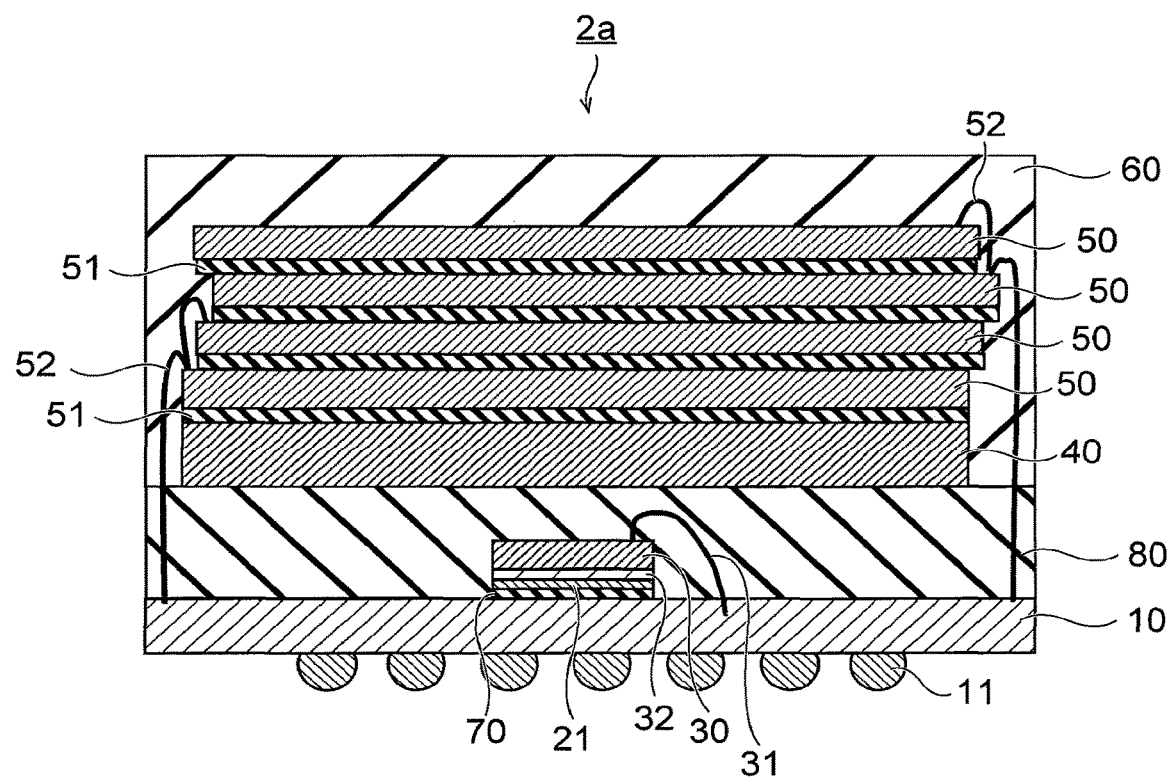
FIG. 3 is a cross-sectional view illustrating a configuration of a semiconductor device according to a modification of the second embodiment.

FIG. 3 is a cross-sectional view illustrating a configuration of a semiconductor device according to a modification of the second embodiment. In the following descriptions, differences between the present modification and the second embodiment are mainly explained.

In a semiconductor device 2a according to the present modification, a gettering layer 32 is formed on the entire back surface of the first semiconductor chip 30, as illustrated in FIG. 3. The gettering layer 32 can be formed by ion implantation of oxygen ions into the back surface of the first semiconductor chip 30, for example. In the gettering layer 32, crystal defects of silicon are generated because of ion implantation of oxygen ions.

The α-ray shielding layer 21 is formed under the gettering layer 32. Also in the present modification, the α-ray shielding layer 21 can be formed by sputtering tungsten, as in the second embodiment. The α-ray shielding layer 21 is a metal layer and therefore can be diffused into the first semiconductor chip 30.

However, in the present modification, because the gettering layer 32 is in contact with the α-ray shielding layer 21, metal contained in the α-ray shielding layer 21 is captured by the gettering layer 32. Therefore, according to the present modification, diffusion of metal into the first semiconductor chip 30 can be avoided.

Third Embodiment

Figure 4:
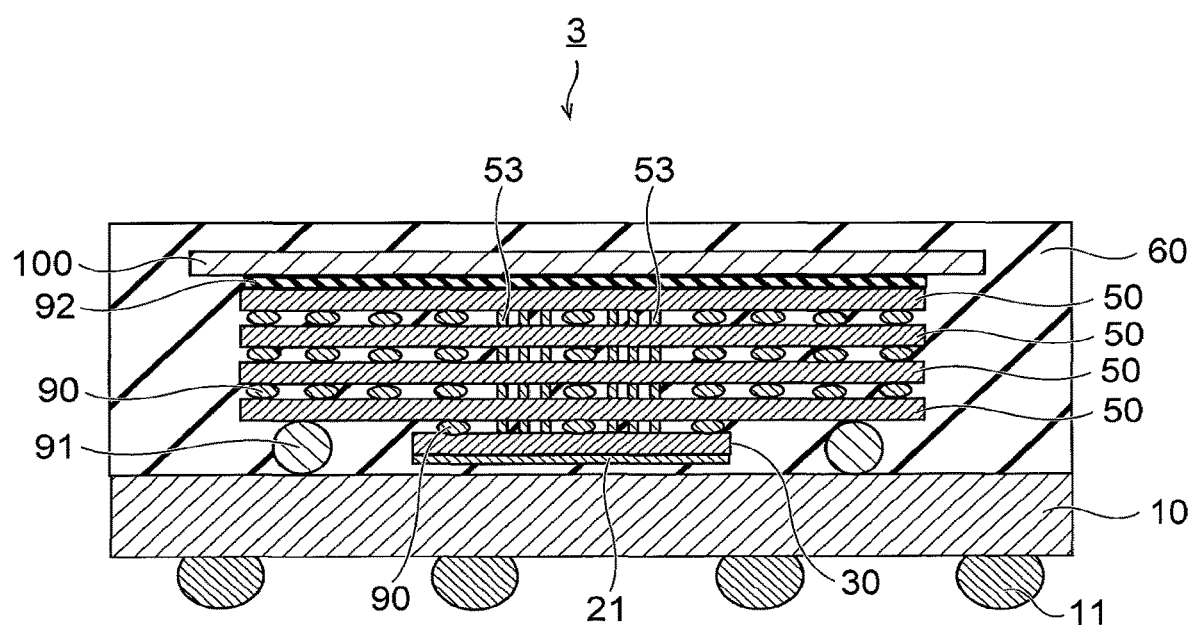
FIG. 4 is a cross-sectional view illustrating a configuration of a semiconductor device according to a third embodiment.

FIG. 4 is a cross-sectional view illustrating a configuration of a semiconductor device according to a third embodiment. Constituent elements identical to those of the semiconductor device 1 according to the first embodiment described above are denoted by like reference characters and detailed descriptions thereof will be omitted.

A semiconductor device 3 illustrated in FIG. 4 is a semiconductor memory having a so-called TSV (Through Silicon Via) structure that enables high-speed signal transmission. That is, the semiconductor device 3 according to the present embodiment includes a through electrode 53 that penetrates the second semiconductor chips 50 stacked on the first semiconductor chip 30.

Each second semiconductor chip 50 is electrically connected to the first semiconductor chip 30 via the through electrode 53. Also, adjacent ones of the second semiconductor chips 50 are bonded to each other with metal bumps 90.

The lowermost second semiconductor chip 50 is bonded to the first semiconductor chip 30 with the metal bump 90 and is also bonded to the package substrate 10 with a solder bump 91. On the other hand, the uppermost second semiconductor chip 50 is bonded to a support substrate 100 with an adhesive 92. The second semiconductor chips 50 are supported by the support substrate 100. Accordingly, the dummy chip 40 described in the first embodiment is unnecessary in the present embodiment.

The α-ray shielding layer 21 is formed on the back surface of the first semiconductor chip 30, as in the second embodiment. Therefore, even if an α-ray is radiated from the package substrate 10 toward the first semiconductor chip 30, this α-ray is shielded by the α-ray shielding layer 21 and does not reach the first semiconductor chip 30. Accordingly, according to the present embodiment, it is possible to avoid malfunctions of the semiconductor device 3 having a TSV structure.

In the present embodiment, the α-ray shielding layer 21 is formed on the back surface of the first semiconductor chip 30. However, the gettering layer 32 described in the above modification may be formed on the back surface of the first semiconductor chip 30 with the α-ray shielding layer 21 formed under the gettering layer 32. In this case, it is possible to avoid diffusion of metal contained in the α-ray shielding layer 21 into the first semiconductor chip 30.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a substrate;
   an α-ray shielding layer on the substrate;
   a first semiconductor chip provided on the α-ray shielding layer; and
   a second semiconductor chip provided on the first semiconductor chip, whose operation is controlled by the first semiconductor chip.

2. The semiconductor device according to claim 1, wherein the α-ray shielding layer is provided in an adhesive that makes the first semiconductor chip adhere to the substrate.

3. The semiconductor device according to claim 2, wherein the adhesive includes a first adhesive layer provided between the substrate and the α-ray shielding layer, and a second adhesive layer provided between the α-ray shielding layer and the first semiconductor chip.

4. The semiconductor device according to claim 1, wherein the α-ray shielding layer contains tungsten (W) or barium sulfate ($BaSO_4$).

5. The semiconductor device according to claim 1, wherein the α-ray shielding layer is a metal layer provided on a back surface of the first semiconductor chip.

6. The semiconductor device according to claim 5, wherein the metal layer is a tungsten layer.

7. The semiconductor device according to claim 5, wherein a through electrode penetrating the second semiconductor chip is provided and the first semiconductor chip is electrically connected to the second semiconductor chip via the through electrode.

8. The semiconductor device according to claim 1, wherein a gettering layer is provided on a back surface of the first semiconductor chip, and the α-ray shielding layer is a metal layer that is in contact with the gettering layer.

9. The semiconductor device according to claim 1, wherein
   the second semiconductor chip is a semiconductor memory chip to hold electronic data, and
   the first semiconductor chip is a controller chip to control an operation of the semiconductor memory chip.

* * * * *